United States Patent
Yang et al.

(10) Patent No.: US 9,748,203 B2
(45) Date of Patent: Aug. 29, 2017

(54) INTEGRATED CIRCUIT PACKAGING SYSTEM WITH CONDUCTIVE PILLARS AND METHOD OF MANUFACTURE THEREOF

(75) Inventors: DeokKyung Yang, Hanam-si (KR); In Sang Yoon, Ichon-si (KR); SeongHun Mun, Incheon (KR); KyungHwan Kim, Seoul (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 138 days.

(21) Appl. No.: 13/327,609

(22) Filed: Dec. 15, 2011

(65) Prior Publication Data

US 2013/0154092 A1    Jun. 20, 2013

(51) Int. Cl.
*H01L 23/48* (2006.01)
*H01L 21/76* (2006.01)
(Continued)

(52) U.S. Cl.
CPC ...... *H01L 25/0657* (2013.01); *H01L 23/3128* (2013.01); *H01L 24/13* (2013.01); *H01L 24/16* (2013.01); *H01L 24/32* (2013.01); *H01L 24/73* (2013.01); *H01L 2224/16145* (2013.01); *H01L 2224/16225* (2013.01); *H01L 2224/16245* (2013.01); *H01L 2224/32145* (2013.01); *H01L 2224/32225* (2013.01); *H01L 2224/32245* (2013.01); *H01L 2224/73204* (2013.01);
(Continued)

(58) Field of Classification Search
CPC ....... H01L 2924/00; H01L 2224/73265; H01L 2224/97; H01L 2224/48247; H01L 2224/48227; H01L 2924/15311; H01L 2224/32245; H01L 2224/73204; H01L 2924/014; H01L 2224/32145; H01L 2224/85; H01L 2924/14; H01L 2924/01082
USPC ....... 257/663, 738, 778, 779–690, 693, 786, 257/E21.503, E21.499, E21.506, E21.509, 257/E21.511; 438/6, 15, 25, 26, 51, 55, 438/64, 106, 111, 123, 127, 128–132, 438/464, 598, 612, 618
See application file for complete search history.

(56) References Cited

U.S. PATENT DOCUMENTS 7,185,426 B1    3/2007 Hiner et al.
7,242,081 B1 *  7/2007 Lee ............................. 257/686
(Continued)

FOREIGN PATENT DOCUMENTS

KR    100961308 B1    6/2010
KR    100961309 B1    6/2010

OTHER PUBLICATIONS

U.S. Appl. No. 13/298,267, filed Nov. 16, 2011, Kim et al.
U.S. Appl. No. 13/237,918, filed Sep. 20, 2011, Choi et al.

*Primary Examiner* — Su C Kim
*Assistant Examiner* — Junaiden Mirsalahuddin
(74) *Attorney, Agent, or Firm* — Wong & Rees LLP

(57) ABSTRACT

A method of manufacture of an integrated circuit packaging system including: providing a package carrier; mounting an integrated circuit to the package carrier; mounting a circuit interposer above the integrated circuit; mounting a mounting integrated circuit above the circuit interposer; forming a conductive pillar to the circuit interposer adjacent to the mounting integrated circuit; connecting the circuit interposer to the package carrier; and forming an encapsulation on the package carrier.

10 Claims, 5 Drawing Sheets

(51) Int. Cl.
*H01L 25/065* (2006.01)
*H01L 23/00* (2006.01)
*H01L 23/31* (2006.01)

(52) U.S. Cl.
CPC ............... *H01L 2224/73253* (2013.01); *H01L 2225/06513* (2013.01); *H01L 2225/06517* (2013.01); *H01L 2225/06596* (2013.01); *H01L 2924/15311* (2013.01); *H01L 2924/18161* (2013.01); *H01L 2924/19107* (2013.01)

(56) References Cited

U.S. PATENT DOCUMENTS

| | | | |
|---|---|---|---|
| 7,345,361 B2 | 3/2008 | Mallik et al. | |
| 7,923,304 B2 | 4/2011 | Choi et al. | |
| 2004/0056344 A1* | 3/2004 | Ogawa | H01L 23/3121 257/686 |
| 2008/0296697 A1* | 12/2008 | Hsu | H01L 23/49827 257/379 |
| 2010/0244024 A1* | 9/2010 | Do | H01L 21/563 257/48 |
| 2010/0244223 A1* | 9/2010 | Cho et al. | 257/690 |
| 2010/0301469 A1* | 12/2010 | Choi et al. | 257/693 |
| 2011/0024887 A1* | 2/2011 | Chi | H01L 21/568 257/684 |
| 2011/0068464 A1 | 3/2011 | Chi et al. | |
| 2011/0089552 A1* | 4/2011 | Park | H01L 21/568 257/686 |
| 2012/0223429 A1* | 9/2012 | Khan | H01L 25/105 257/738 |

\* cited by examiner

US 9,748,203 B2

INTEGRATED CIRCUIT PACKAGING SYSTEM WITH CONDUCTIVE PILLARS AND METHOD OF MANUFACTURE THEREOF

TECHNICAL FIELD

The present invention relates generally to an integrated circuit packaging system, and more particularly to a system for stacking packages.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made using the semiconductor package structures. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Many conventional semiconductor (or "chip") packages are of the type where a semiconductor die is molded into a package with a resin, such as an epoxy molding compound. Numerous package approaches stack multiple integrated circuit dice or package in package (PIP) or a combination. Other approaches include package level stacking or package-on-package (POP). POP designs face reliability challenges and higher cost.

As the outline of these POP designs becomes smaller they are more susceptible to warpage during the solder reflow process. The heat necessary to reflow the solder can cause the package substrate to warp and deform. With ball grid array (BGA) packages, this is a critical problem because of the number of connections between the package and PCB.

Thus, a need still remains for an integrated circuit packaging system improved yield, low profile, and improved reliability. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit including: providing a package carrier; mounting an integrated circuit to the package carrier; mounting a circuit interposer above the integrated circuit; mounting a mounting integrated circuit above the circuit interposer; forming a conductive pillar to the circuit interposer adjacent to the mounting integrated circuit; connecting the circuit interposer to the package carrier; and forming an encapsulation on the package carrier.

The present invention provides an integrated circuit packaging system including: a package carrier, an integrated circuit mounted to the package carrier, a circuit interposer mounted above the integrated circuit, a mounting integrated circuit mounted above the circuit interposer, a conductive pillar formed to the circuit interposer adjacent to the mounting integrated circuit, the circuit interposer connected to the package carrier, and an encapsulation formed on the package carrier.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
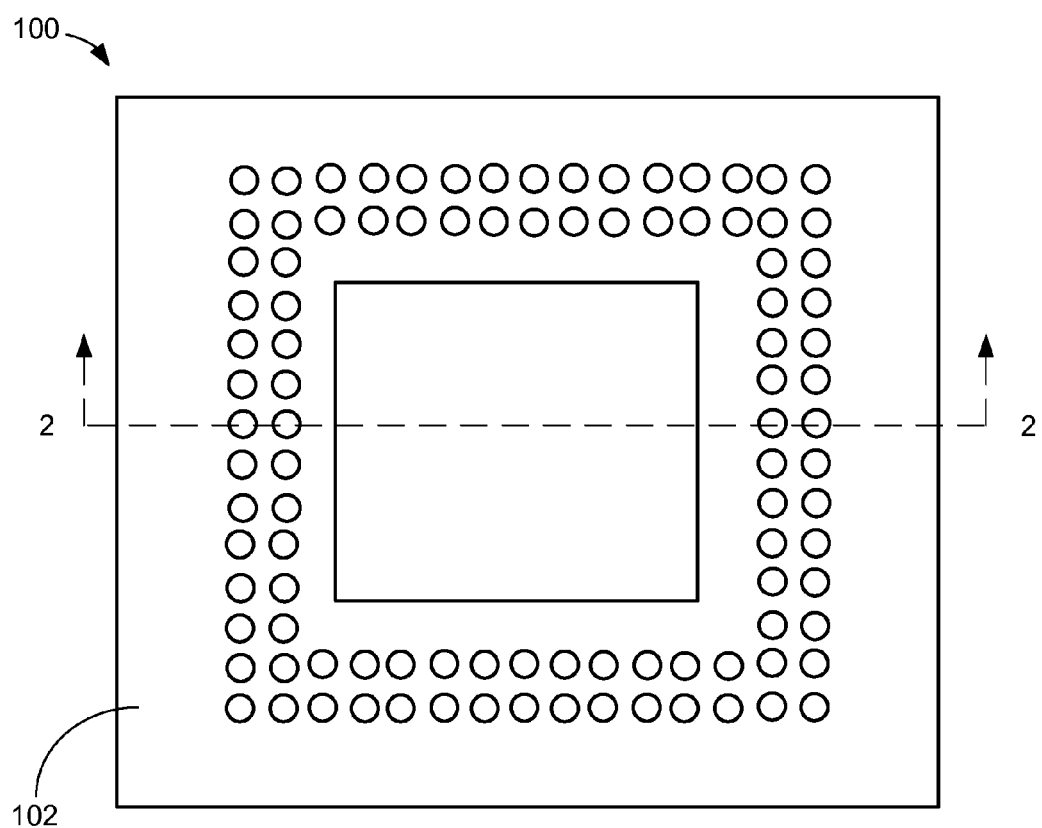
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the active surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements or components with no intervening material.

The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in a first embodiment of the present invention. The integrated circuit packaging system 100 can have an encapsulation 102. The encapsulation 102 is defined as a cover to protect the contents within the integrated circuit packaging system 100 from the environment and provides a hermetic seal.

Figure 2:
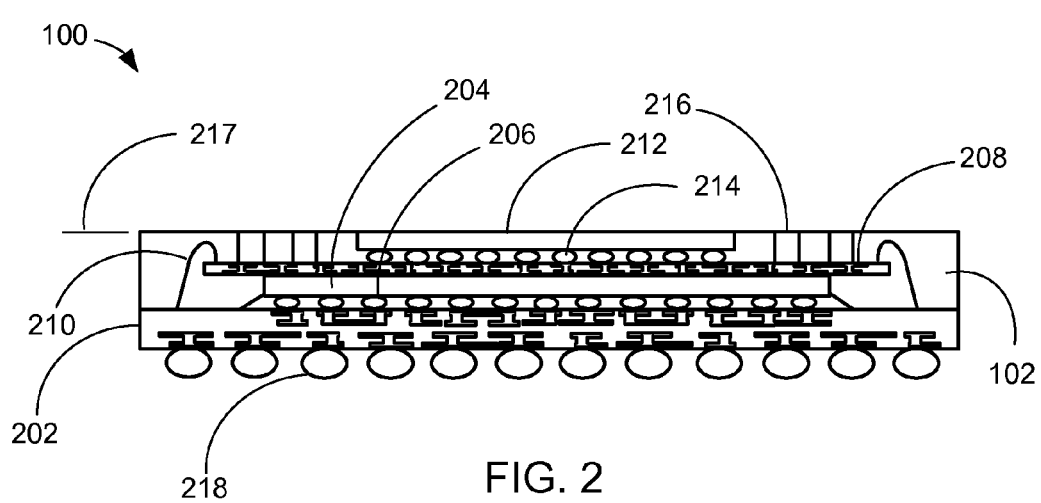
FIG. 2 is a cross-sectional view of an integrated circuit packaging system along a line 2-2 of FIG. 1.

Referring now to FIG. 2, therein is shown a cross-sectional view of an integrated circuit packaging system along a line 2-2 of FIG. 1. The integrated packaging system 100 includes a package carrier 202. The package carrier 202 is defined as a support structure providing a mounting structure to the internal contents of the integrated circuit packaging system 100 as well as conductive paths within, to, and out of the integrated circuit packaging system 100. As examples, the package carrier 202 can be a laminated substrate, a ceramic substrate, or a leadframe type carrier.

An integrated circuit 204 is mounted to and over the package carrier 202. The integrated circuit 204 is defined as an active device having active circuitry fabricated thereon. Examples for the integrated circuit 204 can include an integrated circuit die, a packaged integrated circuit, a wafer chip scale package, or a flip chip.

The integrated circuit 204 can be attached to the package carrier 202 using integrated circuit electrical connectors 206. The integrated circuit electrical connectors 206 are defined as connection structures to electrically and mechanically connect and attach the integrated circuit 204 to the next system level. Examples of the integrated circuit electrical connectors 206 include solder bumps, conductive paste, or conductive posts.

A circuit interposer 208 can be mounted above the integrated circuit 204 using an adhesive. The circuit interposer 208 is defined as an active or passive device having electrical interconnects within, to, and out of the device as through silicon via (TSV) and is the circuit elements are manufactured with semiconductor manufacturing process. As examples, the circuit interposer 208 can be a laminated substrate, a ceramic substrate, a leadframe type device, an integrated passive device, or an active device such as a silicon wafer or an integrated circuit die.

The circuit interposer 208 can include interposer electrical connectors 210. The interposer electrical connectors 210 are defined as connection structures to electrically connect the interposer 208 to the package carrier 202. Examples of the interposer electrical connectors 210 include solder bumps, conductive paste, conductive posts, or a bond wire directly connecting the interposer 208 to the package carrier 202. The bond wire is defined as an electrical connection structure made from a wire or a wiring technology and for the purpose of providing electrical connection between the circuit interposer 208 and package carrier 202.

A mounting integrated circuit 212 can be attached to the interposer 208 using mounting electrical connectors 214. The mounting electrical connectors 214 are defined as connection structures to electrically and mechanically connect and attach the mounting integrated circuit 212 to the interposer 208. Examples of the mounting electrical connectors 214 include solder bumps, conductive paste, or conductive posts.

A conductive pillar 216 can be formed on the circuit interposer 208. The conductive pillar 216 can be formed on the interposer 208 at a level 217 with the planar surface of the encapsulation 102 to provide an electrical connection to the next system level or as a test point to be used during the manufacturing process. Examples of conductive pillars 216 include conductive posts, solder bumps, and conductive paste.

The encapsulation 102 can be formed around the circuit interposer 208, mounting integrated circuit 212, and conductive pillar 216 such that the horizontal surface of the encapsulation 102 is planar with the non active side of the mounting integrated circuit 212 and conductive pillar 216.

The integrated circuit packaging system 100 can be attached to a printed circuit board (PCB) (not shown) using external connectors 218. The external connectors 218 are defined as connection structures to electrically and mechanically connect and attach the integrated circuit packaging system 100 to the next system level. Examples of external connectors 206 include solder bumps, conductive paste, or conductive posts.

It has been discovered that the addition of circuit interposer 208 and the conductive pillar 216 provide several benefits. The circuit interposer 208 along with the interposer electrical connectors 210 allow the mounting integrated circuit 212 circuitry to be directly available to the package carrier 202 and the next system level. The circuit interposer 208 also allows the conductive pillar 216 electrical accessibility to the package carrier 202, the integrated circuit 204, and the mounting integrated circuit 212 for adding additional integrated circuits or for test points to be used during the manufacturing process.

It has also been discovered that exposing the non active side of the mounting integrated circuit 212 and conductive pillar 216 allows for greater heat dissipation increasing the reliability and useful life of the integrated circuit packaging system 100.

Figure 3:
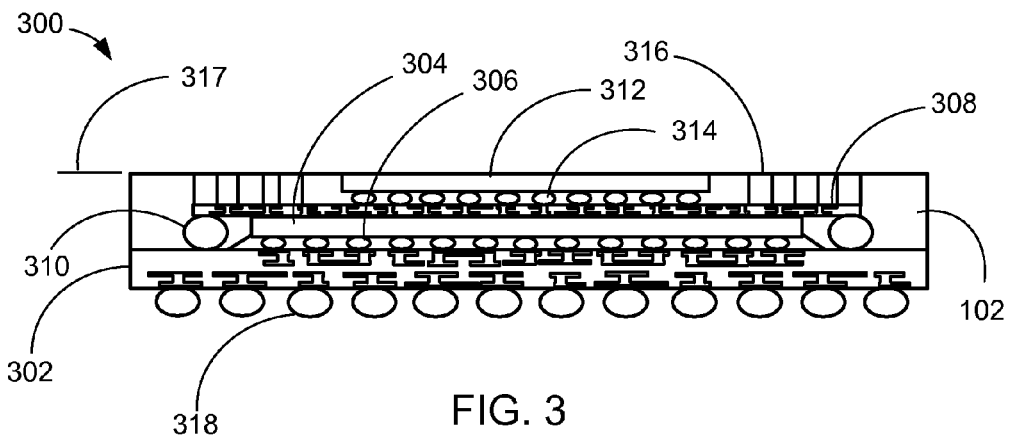
FIG. 3 is a cross-sectional view of an integrated circuit packaging system along a line 2-2 of FIG. 1 exemplified by the top view of FIG. 1 in a second embodiment of the present invention.

Referring now to FIG. 3, therein is shown a cross-sectional view of an integrated circuit packaging system along a line 2-2 of FIG. 1 exemplified by the top view of FIG. 1 in a second embodiment of the present invention. The integrated packaging system 300 includes a package carrier 302. The package carrier 302 is defined as a support structure providing a mounting structure to the internal contents of the integrated circuit packaging system 300 as well as conductive paths within, to, and out of the integrated circuit packaging system 300. As examples, the package carrier 302 can be a laminated substrate, a ceramic substrate, or a leadframe type carrier. An integrated circuit 304 is mounted to and over the package carrier 302. The integrated circuit 304 is defined as an active device having active circuitry fabricated thereon. Examples for the integrated circuit 304 can include an integrated circuit die, a packaged integrated circuit, a wafer chip scale package, or a flip chip.

The integrated circuit 304 can be attached to the package carrier 302 using integrated circuit electrical connectors 306. The integrated circuit electrical connectors 306 are defined as connection structures to electrically and mechanically connect and attach the integrated circuit 304 to the next system level. Examples of the integrated circuit electrical connectors 306 include solder bumps, conductive paste, or conductive posts.

A circuit interposer 308 can be mounted above the integrated circuit 304 using an adhesive. The circuit interposer 308 is defined as an active or passive device having electrical interconnects within, to, and out of the device as through silicon via (TSV) and manufactured in a semiconductor manufacturing process. As examples, the circuit interposer 308 can be a laminated substrate, a ceramic substrate, a leadframe type device, or an active device such as a silicon wafer or an integrated circuit die The circuit interposer 308 can include interposer electrical connectors 310. The interposer electrical connectors 310 are defined as connection structures to electrically connect the interposer 308 to the package carrier 302. Examples of the interposer electrical connectors 310 include solder bumps, conductive paste, or conductive posts. In addition to providing an electrical connection between the package carrier 302 and the circuit interposer 308, the interposer electrical connectors 310 can add mechanical support to the circuit interposer 308 keeping the circuit interposer 308 from warping during the solder reflow process or the many thermal cycles the integrating packaging system 300 can be subjected to.

A mounting integrated circuit 312 can be attached to the circuit interposer 308 using mounting electrical connectors 314. The mounting electrical connectors 314 are defined as connection structures to electrically and mechanically connect and attach the mounting integrated circuit 312 to the circuit interposer 308. Examples of the mounting electrical connectors 314 include solder bumps, conductive paste, or conductive posts.

A conductive pillar 316 can be formed on the circuit interposer 308. The conductive pillar 316 can be formed on the circuit interposer 308 at a level 317 with the planar surface of the encapsulation 102 to provide an electrical connection to the next system level or as a test point to be used during the manufacturing process. Examples of conductive pillars 316 include conductive posts, solder bumps, and conductive paste.

The integrated circuit packaging system 300 can be attached to a printed circuit board (PCB) (not shown) using external connectors 318. The external connectors 318 are defined as connection structures to electrically and mechanically connect and attach the integrated circuit packaging system 300 to the next system level. Examples of external connectors 306 include solder bumps, conductive paste, or conductive posts.

The encapsulation 102 can be formed around the circuit interposer 308, mounting integrated circuit 312, and conductive pillar 316 such that the horizontal surface of the encapsulation 102 is planar with the non active side of the mounting integrated circuit 312 and conductive pillar 316.

It has been discovered that the addition of circuit interposer 308 and the conductive pillar 316 provide several benefits. The circuit interposer 308 along with the interposer electrical connectors 310 allow the mounting integrated circuit 312 circuitry to be directly available to the package carrier 302 and the next system level. The circuit interposer 308 also allows the conductive pillar 316 electrical accessibility to the package carrier 302, the integrated circuit 304, and the mounting integrated circuit 312 for adding additional integrated circuits or for test points to be used during the manufacturing process.

It has also been discovered that exposing the non active side of the mounting integrated circuit 312 and conductive pillar 316 allows for greater heat dissipation increasing the reliability and useful life of the integrated circuit packaging system 300.

Figure 4:
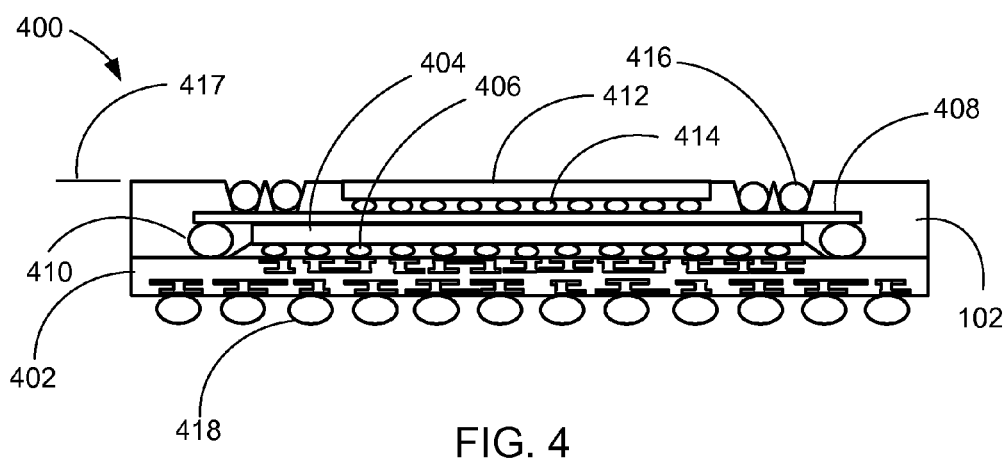
FIG. 4 is a cross-sectional view of an integrated circuit packaging system along a line 2-2 of FIG. 1 exemplified by the top view of FIG. 1 in a third embodiment of the present invention.

Referring now to FIG. 4, therein is shown a cross-sectional view of an integrated circuit packaging system along a line 2-2 of FIG. 1 exemplified by the top view of FIG. 1 in a third embodiment of the present invention. The integrated packaging system 400 includes a package carrier 402. The package carrier 402 is defined as a support structure providing a mounting structure to the internal contents of the integrated circuit packaging system 400 as well as conductive paths within, to, and out of the integrated circuit packaging system 400. As examples, the package carrier 402 can be a laminated substrate, a ceramic substrate, or a leadframe type carrier. An integrated circuit 404 is mounted to and over the package carrier 402. The integrated circuit 404 is defined as an active device having active circuitry fabricated thereon. Examples for the integrated circuit 404 can include an integrated circuit die, a packaged integrated circuit, a wafer chip scale package, or a flip chip.

The integrated circuit 404 can be attached to the package carrier 402 using integrated circuit electrical connectors 406. The integrated circuit electrical connectors 406 are defined as connection structures to electrically and mechanically connect and attach the integrated circuit 404 to the next system level. Examples of the integrated circuit electrical connectors 406 include solder bumps, conductive paste, or conductive posts.

A circuit interposer 408 can be mounted above the integrated circuit 404. The circuit interposer 408 is defined as an active or passive device having electrical interconnects within, to, and out of the device as through silicon via and manufactured in a semiconductor fabrication process. As examples, the circuit interposer 408 can be a laminated substrate, a ceramic substrate, a leadframe type device, or an active device such as a silicon wafer or an integrated circuit die.

The circuit interposer 408 can include interposer electrical connectors 410. The interposer electrical connectors 410 are defined as connection structures to electrically connect the circuit interposer 408 to the package carrier 402. Examples of the interposer electrical connectors 410 include solder bumps, conductive paste, or conductive posts. In addition to providing an electrical connection between the package carrier 402 and the circuit interposer 408, the interposer electrical connectors 410 can add mechanical support to the circuit interposer 408 keeping the circuit interposer 408 from warping during the solder reflow process or the many thermal cycles the integrating packaging system 400 can be subjected to.

A mounting integrated circuit 412 can be attached to the circuit interposer 408 using mounting electrical connectors 414. The mounting electrical connectors 414 are defined as connection structures to electrically and mechanically connect and attach the mounting integrated circuit 412 to the circuit interposer 408. Examples of the mounting electrical connectors 414 include solder bumps, conductive paste, or conductive posts.

A conductive pillar 416 can be formed on the circuit interposer 408. The conductive pillar 416 can be formed on the circuit interposer 408 at a level 417 with the planar surface of the encapsulation 102 to provide an electrical connection to the next system level or as a test point to be used during the manufacturing process. Examples of conductive pillars 416 include conductive posts, solder bumps, and conductive paste.

The encapsulation 102 can be formed around the circuit interposer 408, mounting integrated circuit 412, and conductive pillar 416 such that the horizontal surface of the encapsulation 102 is planar with the non active side of the mounting integrated circuit 412 and conductive pillar 416.

The integrated circuit packaging system 400 can be attached to a printed circuit board (PCB) (not shown) using external connectors 418. The external connectors 418 are defined as connection structures to electrically and mechanically connect and attach the integrated circuit packaging system 400 to the next system level. Examples of external connectors 406 include solder bumps, conductive paste, or conductive posts.

It has been discovered that the addition of circuit interposer 408 and the conductive pillar 416 provide several benefits. The circuit interposer 408 along with the interposer electrical connectors 410 allow the mounting integrated circuit 412 circuitry to be directly available to the package carrier 402 and the next system level. The circuit interposer 408 also allows the conductive pillar 416 electrical accessibility to the package carrier 402, the integrated circuit 404, and the mounting integrated circuit 412 for adding additional integrated circuits or for test points to be used during the manufacturing process.

It has also been discovered that exposing the non active side of the mounting integrated circuit 412 and conductive pillar 416 allows for greater heat dissipation increasing the reliability and useful life of the integrated circuit packaging system 400.

Figure 5:
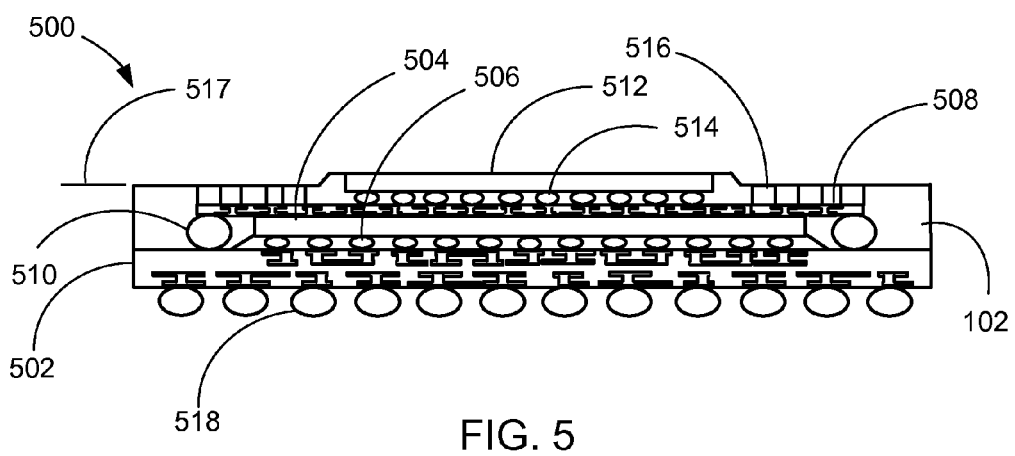
FIG. 5 is a cross-sectional view of an integrated circuit packaging system along a line 2-2 of FIG. 1 exemplified by the top view of FIG. 1 in a fourth embodiment of the present invention.

Referring now to FIG. 5, therein is shown a cross-sectional view of an integrated circuit packaging system along a line 2-2 of FIG. 1 exemplified by the top view of FIG. 1 in a fourth embodiment of the present invention. The integrated packaging system 500 includes a package carrier 502. The package carrier 502 is defined as a support structure providing a mounting structure to the internal contents of the integrated circuit packaging system 500 as well as conductive paths within, to, and out of the integrated circuit packaging system 500. As examples, the package carrier 502 can be a laminated substrate, a ceramic substrate, or a leadframe type carrier. An integrated circuit 504 is mounted to and over the package carrier 502. The integrated circuit 504 is defined as an active device having active circuitry fabricated thereon. Examples for the integrated circuit 504 can include an integrated circuit die, a packaged integrated circuit, a wafer chip scale package, or a flip chip.

The integrated circuit 504 can be attached to the package carrier 502 using integrated circuit electrical connectors 506. The integrated circuit electrical connectors 506 are defined as connection structures to electrically and mechanically connect and attach the integrated circuit 504 to the next system level. Examples of the integrated circuit electrical connectors 506 include solder bumps, conductive paste, or conductive posts.

A circuit interposer 508 can be mounted above the integrated circuit 504 using an adhesive. The circuit interposer 508 is defined as an active or passive device having electrical interconnects within, to, and out of the device as a through silicon via (TSV) and manufactured with a semiconductor fabrication process. As examples, the circuit interposer 508 can be a laminated substrate, a ceramic substrate, a leadframe type device, or an active device such as a silicon wafer or an integrated circuit die.

The circuit interposer 508 can include interposer electrical connectors 510. The interposer electrical connectors 510 are defined as connection structures to electrically connect the circuit interposer 508 to the package carrier 502. Examples of the interposer electrical connectors 510 include solder bumps, conductive paste, or conductive posts. In addition to providing an electrical connection between the package carrier 502 and the circuit interposer 508, the interposer electrical connectors 510 can add mechanical support to the circuit interposer 508 keeping the circuit interposer 508 from warping during the solder reflow process or the many thermal cycles the integrating packaging system 200 can be subjected to.

A mounting integrated circuit 512 can be attached to the circuit interposer 508 using mounting electrical connectors 514. The mounting electrical connectors 514 are defined as connection structures to electrically and mechanically connect and attach the mounting integrated circuit 512 to the circuit interposer 508. Examples of the mounting electrical connectors 514 include solder bumps, conductive paste, or conductive posts.

A conductive pillar 516 can be formed on the circuit interposer 508. The conductive pillar 516 can be formed on the circuit interposer 508 at a level 517 with the planar surface of the encapsulation 102 to provide an electrical connection to the next system level or as a test point to be used during the manufacturing process. Examples of conductive pillars 516 include conductive posts, solder bumps, and conductive paste.

The encapsulation 102 can be formed around the circuit interposer 508, mounting integrated circuit 512, and conductive pillar 516 such that the horizontal surface of the encapsulation 102 is planar with the non-active side of the mounting integrated circuit 512. The encapsulation 102 can also be formed such that a planar surface of the encapsulation 102 and conductive pillar 516 is below the planar surface of the mounting integrated circuit 512. In this embodiment, the encapsulation 102 is below the top surface of the mounting integrated circuit 512 in order to make the integrated packaging system 500 thinner or to allow for adding an additional integrated circuit to the integrated circuit packaging system 500.

The integrated circuit packaging system 500 can be attached to a printed circuit board (PCB) (not shown) using external connectors 518. The external connectors 518 are defined as connection structures to electrically and mechanically connect and attach the integrated circuit packaging system 500 to the next system level. Examples of external connectors 506 include solder bumps, conductive paste, or conductive posts.

It has been discovered that the addition of circuit interposer 508 and the conductive pillar 516 provide several benefits. The circuit interposer 508 along with the interposer electrical connectors 510 allow the mounting integrated circuit 512 circuitry to be directly available to the package carrier 502 and the next system level. The circuit interposer 508 also allows the conductive pillar 516 electrical accessibility to the package carrier 502, the integrated circuit 504, and the mounting integrated circuit 512 for adding additional integrated circuits or for test points to be used during the manufacturing process.

It has also been discovered that exposing the non active side of the mounting integrated circuit 512 and conductive pillar 516 allows for greater heat dissipation increasing the reliability and useful life of the integrated circuit packaging system 500.

Figure 6:
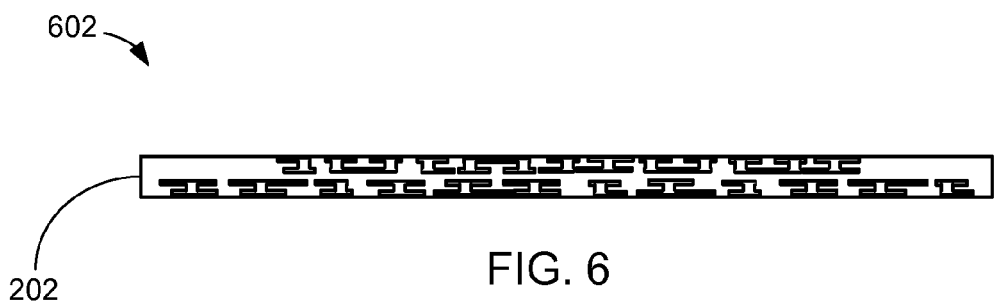
FIG. 6 is a cross sectional view of the integrated circuit packaging system of FIG. 1 in a manufacturing step with a carrier strip having the package carrier.

Referring now to FIG. 6, therein is shown a cross sectional view of the integrated circuit packaging system 100 of FIG. 1 in a manufacturing step with a carrier strip 602 having the package carrier 202. The carrier strip 602 is a series of laminated or ceramic substrates containing mechanical and electrical interconnects that are cut into individual package carriers 202. The package carrier 202 is a support structure providing a mounting structure to the internal contents of the integrated circuit packaging system 100 as well as conductive paths within, to, and out of the integrated circuit packaging system 100. As examples, the package carrier 202 can be a laminated substrate, a ceramic substrate, or a leadframe type carrier.

Figure 7:
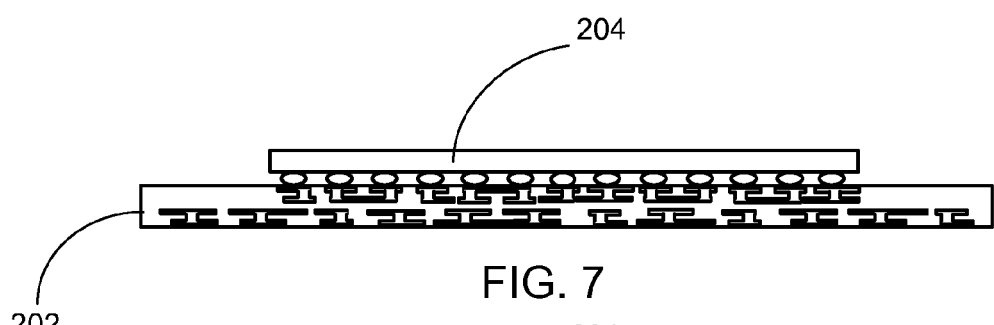
FIG. 7 is the structure of FIG. 6 in a mounting step for the integrated circuit.

Referring now to FIG. 7, therein is shown the structure of FIG. 6 in a mounting step for the integrated circuit 204. The integrated circuit 204 is mounted to and over the package carrier 202. The integrated circuit 204 is an active device having active circuitry fabricated thereon. Examples for the integrated circuit 204 can include an integrated circuit die, a packaged integrated circuit, a wafer chip scale package, or a flip chip.

Figure 8:
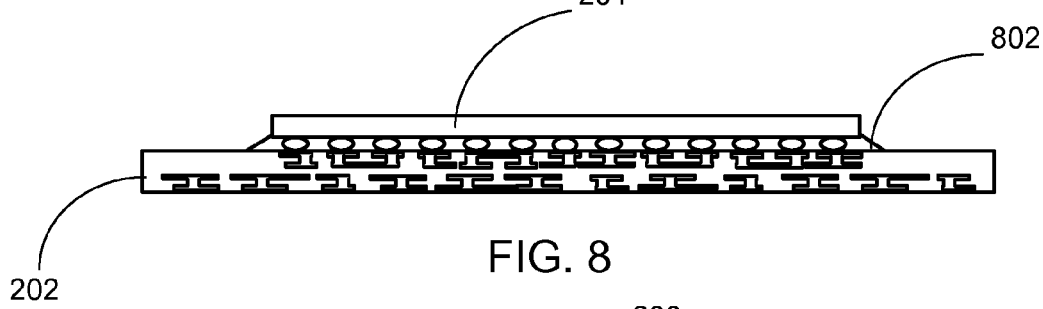
FIG. 8 is the structure of FIG. 7 in a mounting step for underfill.

Referring now to FIG. 8, therein is shown the structure of FIG. 7 in a mounting step for underfill 802. The underfill 802 is an encapsulation for the integrated circuit 204 and seals the connection between the integrated circuit 204 and the package carrier 202.

Figure 9:
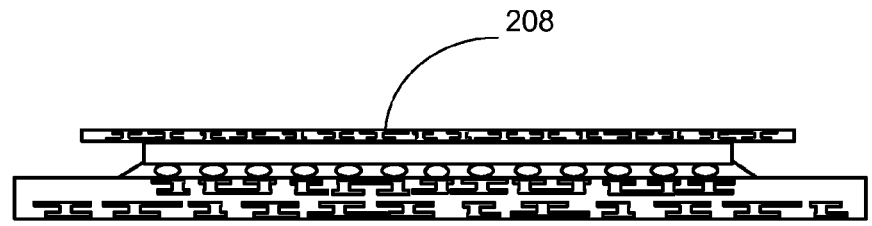
FIG. 9 is the structure of FIG. 8 in a mounting step for the circuit interposer.

Referring now to FIG. 9, therein is shown the structure of FIG. 8 in a mounting step for the circuit interposer 208. The circuit interposer 208 is defined above.

Figure 10:
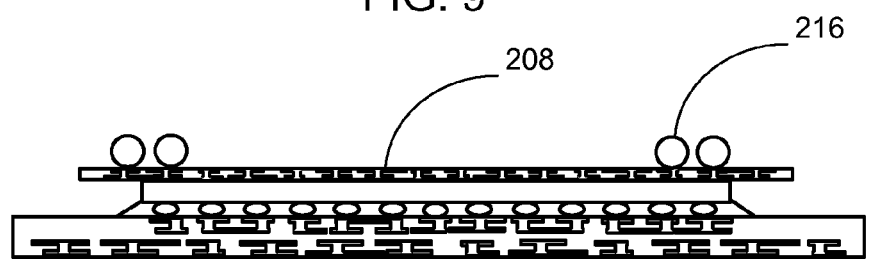
FIG. 10 is the structure of FIG. 9 in a mounting step for the conductive pillar.

Referring now to FIG. 10, therein is shown the structure of FIG. 9 in a mounting step for the conductive pillar 216. The conductive pillar 216 can be formed on the interposer 208 to provide an electrical connection to the next system level or as a test point to be used during the manufacturing process. Examples of conductive pillars 216 include solder bumps, conductive paste, and conductive posts.

Figure 11:
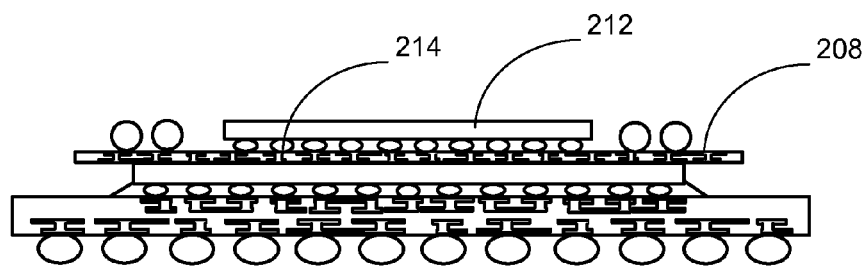
FIG. 11 is the structure of FIG. 10 in a mounting step for mounting a mounting integrated circuit.

Referring now to FIG. 11, therein is shown the structure of FIG. 10 in a mounting step for the mounting integrated circuit 212. A mounting integrated circuit 212 can be attached to the interposer 208 using mounting electrical connectors 214. The mounting electrical connectors 214 are defined as connection structures to electrically and mechanically connect and attach the mounting integrated circuit 212 to the interposer 208.

Figure 12:
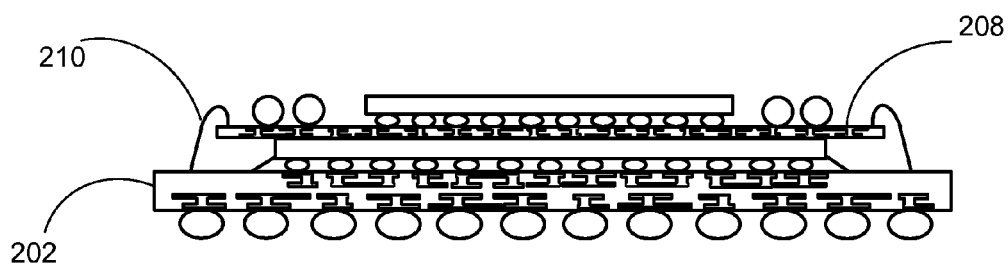
FIG. 12 is the structure of FIG. 11 in a mounting step for mounting interposer electrical connectors.

Referring now to FIG. 12, therein is shown the structure of FIG. 11 in a mounting step for mounting interposer electrical connectors 210. The interposer electrical connectors 210 are defined as connection structures to electrically connect the interposer 208 to the package carrier 202. Examples of the interposer electrical connectors 210 include solder bumps, conductive paste, conductive posts, or a bond wire directly connecting the interposer 208 to the package carrier 202.

Figure 13:
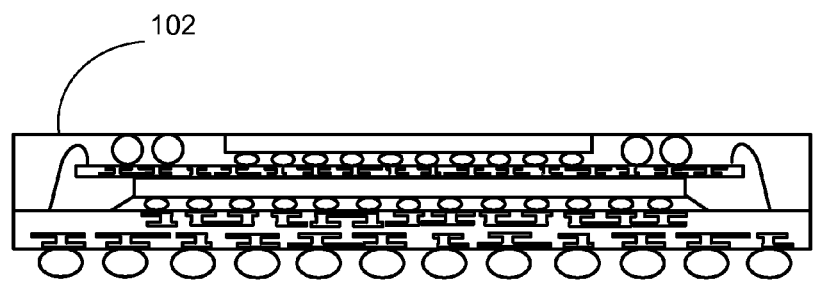
FIG. 13 is the structure of FIG. 12 in a mounting step for encapsulation.

Referring now to FIG. 13, therein is shown the structure of FIG. 12 in a mounting step for encapsulation 102. The encapsulation 102 is defined as a cover to protect the contents within the integrated circuit packaging system 100 from the environment and provides a hermetic seal.

Figure 14:
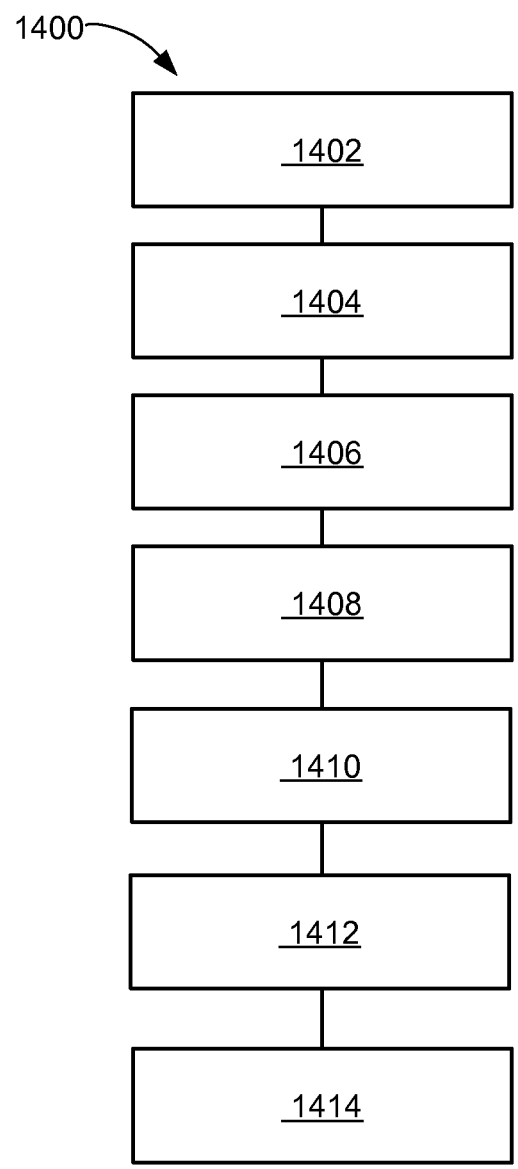
FIG. 14 is a flow chart of a method of manufacture of an integrated circuit packaging system in an embodiment of the present invention.

Referring now to FIG. 14, therein is shown a flow chart of a method 1400 of manufacture of an integrated circuit packaging system 100 in an embodiment of the present invention. The method 1400 includes: providing a package carrier in a block 1402; mounting an integrated circuit to the package carrier in a block 1404; mounting a circuit interposer above the integrated circuit in a block 1406; mounting a mounting integrated circuit above the circuit interposer in a block 1408; forming a conductive pillar to the circuit interposer adjacent to the mounting integrated circuit in a block 1410; connecting the circuit interposer to the package carrier in a block 1412; and forming an encapsulation on the package carrier in a block 1414.

Thus, it has been discovered that the integrated circuit packaging system of the present invention furnishes important and heretofore unknown and unavailable solutions, capabilities, and functional aspects for wiring technology for external connections. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing the integrated circuit packaging systems/fully compatible with conventional manufacturing methods or processes and technologies.

Another important aspect of the present invention is that it valuably supports and services the historical trend of reducing costs, simplifying systems, and increasing performance. These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:
1. An integrated circuit packaging system comprising:
a package carrier;
a first integrated circuit mounted to the package carrier;
an underfill between the package carrier and the first integrated circuit;

a circuit interposer mounted above the first integrated circuit and connected to the package carrier, wherein the circuit interposer is an integrated passive device or an active device;

a second integrated circuit mounted above the circuit interposer;

a conductive pillar formed to the circuit interposer adjacent to the second integrated circuit; and an encapsulation formed on the package carrier and the second integrated circuit, a non-active side of the second integrated circuit exposed from and coplanar with a horizontal surface of the encapsulation; and wherein a top surface of the conductive pillar is below a top surface of the second integrated circuit, and the top surface of the conductive pillar and the top surface of the second integrated circuit are exposed from the encapsulation.

2. The system as claimed in claim 1 further comprising interposer electrical connectors between the first integrated circuit and the package carrier.

3. The system as claimed in claim 1 further comprising solder balls between the circuit interposer and the package carrier.

4. The system as claimed in claim 1 wherein the conductive pillar is at a level planar with the top of the encapsulation.

5. The system as claimed in claim 1 wherein the conductive pillar formed to the circuit interposer is at a level planar with a surface of the encapsulation and below a non-active surface of the second integrated circuit.

6. The system as claimed in claim 1 wherein the circuit interposer mounted above the first integrated circuit is an integrated circuit interposer.

7. The system as claimed in claim 6 wherein the circuit interposer mounted above the first integrated circuit is electrically connected to the package carrier with bond wire interposer electrical connectors.

8. The system as claimed in claim 6 wherein the circuit interposer mounted above the first integrated circuit is electrically connected to the package carrier with solder balls.

9. The system as claimed in claim 6 wherein the conductive pillar formed to the circuit interposer includes the conductive pillar at a level planar with the top of the encapsulation.

10. The system as claimed in claim 6 wherein the conductive pillar formed to the circuit interposer is at a level planar with a surface of the encapsulation and below a non-active surface of the second integrated circuit.

* * * * *